United States Patent
DiMaria

(10) Patent No.: US 6,880,441 B1
(45) Date of Patent: Apr. 19, 2005

(54) PRECISION PUNCH AND DIE DESIGN AND CONSTRUCTION

(75) Inventor: Ferdinand D. DiMaria, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/660,611

(22) Filed: Jun. 6, 1996

(51) Int. Cl.[7] ............................................. B26F 1/14
(52) U.S. Cl. ........................ 83/146; 83/588; 83/685; 83/686; 83/929.1
(58) Field of Search ................. 83/685, 929.1, 83/145, 146, 686, 687, 691, 588, 618, 620, 132, 133, 138, 139, 140, 141, 142, 143, 533, 660, 684, 688, 689, 690; 76/107.1; 29/465

(56) References Cited

U.S. PATENT DOCUMENTS

| | | | | |
|---|---|---|---|---|
| 2,299,534 A | * | 10/1942 | De Lorme | ................ 83/686 X |
| 2,825,407 A | * | 3/1958 | Widell | .......................... 83/687 |
| 3,125,917 A | * | 3/1964 | Smeets | ......................... 83/140 |
| 3,477,317 A | * | 11/1969 | Liander | ...................... 76/107.1 |
| 3,496,818 A | * | 2/1970 | Porter et al. | ................... 83/140 |
| 3,608,413 A | * | 9/1971 | Borello | ...................... 83/687 X |
| 3,797,342 A | * | 3/1974 | Sekel | ..................... 83/929.1 X |
| 4,821,614 A | | 4/1989 | Fleet et al. | ................... 83/100 |
| 4,898,056 A | * | 2/1990 | Grobb et al. | .................. 83/689 |
| 5,303,618 A | * | 4/1994 | Norell | ....................... 76/107.1 |

FOREIGN PATENT DOCUMENTS

SU            574322        *  9/1977   ................. 83/685

* cited by examiner

Primary Examiner—Clark F. Dexter
(74) Attorney, Agent, or Firm—DeLio & Peterson, LLC; Robert Curcio; James J. Cioffi

(57) ABSTRACT

A precision punch and die device for punching holes in a ceramic substrate and method of assembling the device. The device comprises a punch which moves relative to a substrate for punching a hole in the substrate and a die assembly including one or more precision die plates and support plates for guiding a punch and punching a substrate.

11 Claims, 13 Drawing Sheets

PRECISION PUNCH AND DIE DESIGN AND CONSTRUCTION

BACKGROUND OF THE INVENTION

1. Field of the Invention

This invention relates to an apparatus for punching precision holes and in particular a device for punching precision holes in material used for mounting multiple integrated circuits and for creating holes used for interchip connections in the precision punched material.

2. Description of Related Art

Circuit boards with multiple VLSI circuit chips are called Multichip Modules (MCM). The use of VLSI circuits present interface problems relating to the interconnection of the integrated circuits to other circuits and the placement of the integrated circuits on a ceramic circuit board (MCM-C). As VLSI technology has advanced, the density of circuits on a single VLSI chip has increased and the necessary interconnection for VLSI chips has become increasingly difficult to achieve in a limited space. An MCM-C design object is to increase the ratio of the total area occupied by silicon to the total board area, called silicon efficiency ratio. The MCM-C packaging limits the speed and size of a system. Since the physical interconnection is a the limiting design factor, a means of accommodating more circuit interconnections is necessary.

In a typical configuration, semiconductor chips are mounted in cavities on multilayer circuit boards, the circuit boards accommodate intercircuit connections through tiny vertical holes or VIAs between the layers. The chips are connected to the VIAs using a controlled-collapsed-chip-connection technique called C-4. The VIAs are filled with a conductive material, such as molybdenum paste, which creates a connection to the VLSI circuit. The size of the holes dictates the size of the connection and the number of connections that can be facilitated on the multilayer circuit board.

There are a number of methods for creating small holes in precision tooling for facilitating the punching of VIAs including laser cutting and electrical discharge machining. The precision tooling of each of these methods facilitates the punching of VIA holes as small as 0.01778 cm (0.007 in.) in dielectric material as thin as 0.00762 cm (0.003 in.). The precision tooling is used in a master punch and die assembly.

In the precision punching method, each precision VIA hole is punched in a workpiece or substrate using precision tooling which includes a precision punch assembly and a precision die assembly. The punches of the precision tooling device are guided by precision holes in one or more precision plates. The cutting edge of the die plate is formed by precision openings in the die plate. The precision of the tooling is the limiting factor in providing a precision punched substrate. Prior art is directed to the precision necessary for the creation of the smallest possible precision holes in a substrate.

The VIAs necessary to create the circuit interconnection have previously been created by a punch and die device which is fabricated by making a die mask or plate using electrical discharge machining (EDM). The plate is fabricated from 0.127 cm (0.050 in.) tool steel. Precision holes as small as 0.01651 cm (0.0065 in.) are burned through two plates at one time by EDM at a rate of approximately 6 holes per hour. The plates are then used in a precision tooling device. The size of the substrate hole punched by the precision tooling is limited by the size of the smallest plate opening which can be created by EDM, 0.01651 cm (0.0065 in.). The EDM plate facilitates punching holes with an accuracy of 0.00762 cm (0.003 in.) true position. These tool steel plates are heavy, expensive and require sharpening. The sharpening is time consuming and can only be done several times before the die must be replaced due to wear.

Bearing in mind the problems and deficiencies of the prior art, it is therefore an object of the present invention to provide a punch and die for punching precision holes whereby true position accuracy is improved.

It is another object of the present invention to provide a die which is much lighter in weight than prior art dies.

A further object of the present invention is to provide a device which has lower cost to construct.

A further object of the present invention is to provide a device which punches the smallest possible precision holes in a substrate.

A further object of the present invention is to provide a device which punches straighter holes than prior art devices.

It is yet another object of the present invention to provide a device to punch precision holes in variable patterns.

Still other objects and advantages of the invention will in part be obvious and will in part be apparent from the specification.

SUMMARY OF THE INVENTION

The above and other objects, which will be apparent to those skilled in the art, are achieved by the present invention which in a first aspect relates to a device for punching precision holes. The precision tooling device comprises a punch movable relative to a substrate for punching a hole in the substrate, a punch assembly and a die assembly. The punch assembly includes: a first die plate on one side of the substrate having a die opening therein corresponding to the punch for guiding the punch during movement; and a first support plate adjacent to the first die plate and secured thereto, the support plate having an opening corresponding to the die plate opening and larger than the die plate opening. The die assembly includes: a second die plate on the other side of the substrate having a die opening therein corresponding to the punch for cooperating with the punch for punching a hole in the substrate; and second support plate adjacent to the second die plate and secured thereto, the support plate having an opening corresponding to the die plate opening and larger than the die plate opening.

In an alternate embodiment, passages for the flow of air are etched into the second support plate of the die assembly in order to facilitate the removal of slugs punched from the substrate.

The punch and die assemblies have multiple layers of support plates and die plates which locate the precision holes and support and guide the punch.

In another aspect, the present invention relates to a method of making a precision tooling device for use with a punch for punching a hole in the substrate by initially providing first and second die plates, each die plate having an opening corresponding to the punch; providing first and second support plates, each support plate having an opening larger than the die plate openings. The method comprises the steps of securing the first die plate to the first support plate such that the first die plate opening is aligned with the first support plate opening; securing the second die plate to the second support plate such that the second die plate opening is aligned with the second support plate opening; positioning the first die and support plates above the substrate; and positioning the second die and support plates below the substrate such that the first die and support plate openings are aligned with the second die and support plate openings.

The assembled device is used to punch holes in a substrate. In another aspect the present invention relates to a method of punching a hole using precision die sheets by initially providing a precision tooling apparatus which comprises a punch movable relative to a substrate for punching a hole in the substrate, a punch assembly and a die assembly. The punch assembly includes: a first die plate on one side of the substrate, having a die opening therein corresponding to the punch for guiding the punch during movement; and a first support plate adjacent to the first die plate and secured thereto, the support plate having an opening corresponding to the die plate opening and larger than the die plate opening. The die assembly includes: a second die plate on the other side of the substrate, having a die opening therein corresponding to the punch for cooperating with guiding the punch for punching a hole in the substrate; and a second support plate adjacent to the second die plate and secured thereto, the support plate having an opening corresponding to the die plate opening and larger than the die plate opening. The method comprises the steps of: moving the punch through the first die plate opening; moving the punch through the first support plate opening; contacting the substrate with the punch and punching a hole; moving the punch through the second die plate opening; and moving the punch through the second support plate opening.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
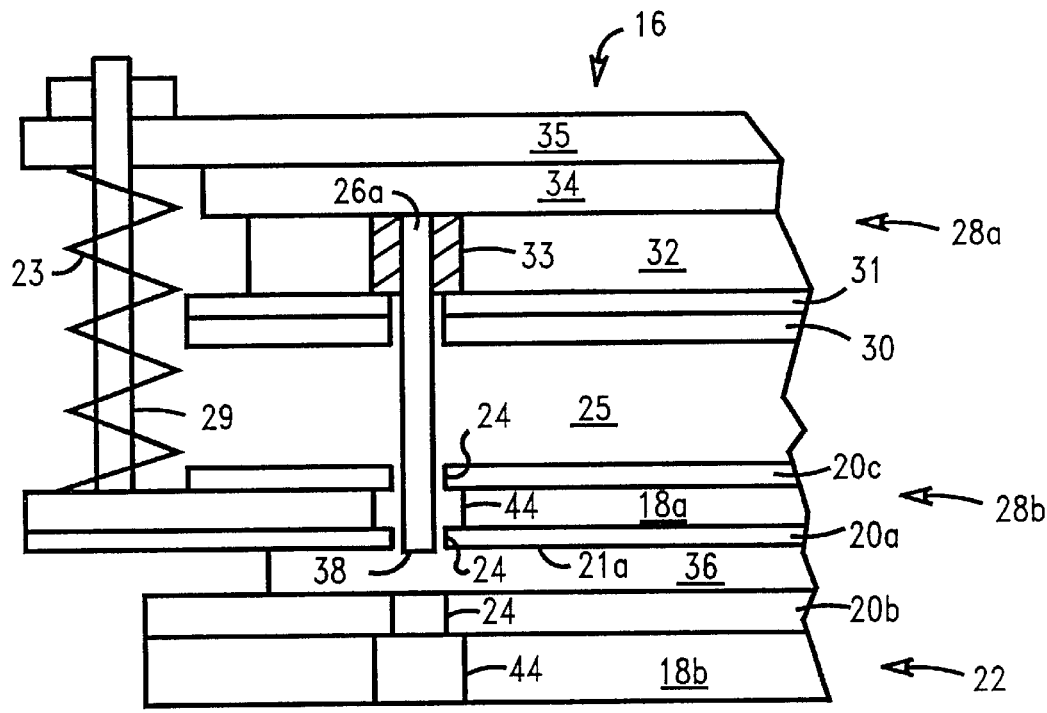
FIG. 1a is a side elevational view of the precision tooling device illustrating the use of an unheaded punch glued into a punch holder insert plate, a first die plate positioned on the front side of a first support plate, a third die plate positioned on the back side of the first support plate and the punch assembly spring in an expanded position creating an expanded air gap in between the first punch assembly and the second punch assembly.

In describing the preferred embodiment of the present invention, reference will be made herein to FIGS. 1–13 of the drawings in which like numerals refer to like features of the invention. Features of the invention are not necessarily shown to scale in the drawings.

Figure 1B:
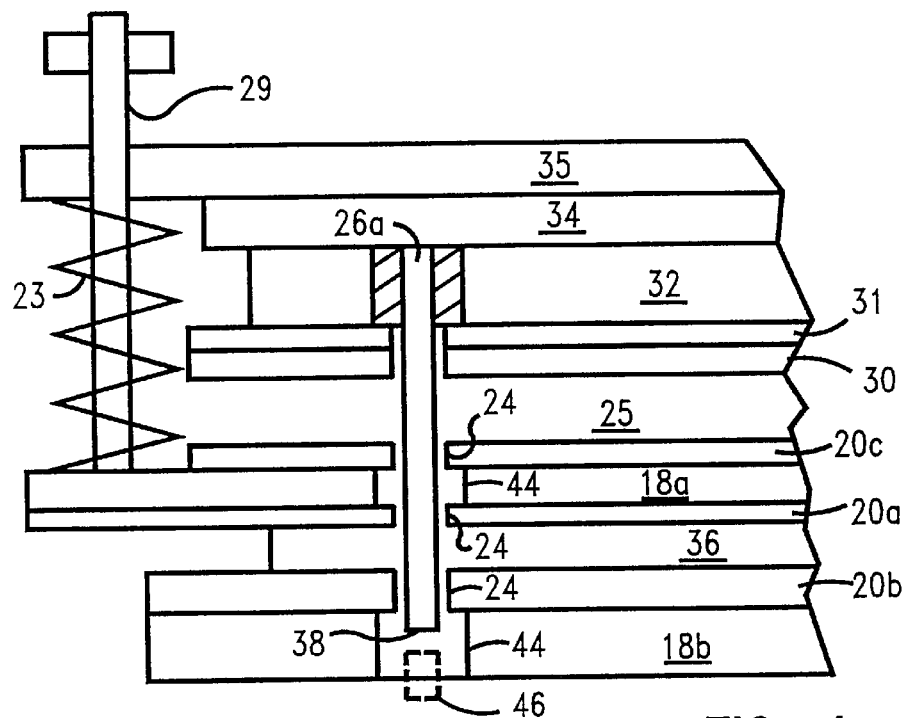
FIG. 1b is a side elevational view of the precision tooling device of FIG. 1a illustrating the punch assembly spring in a contracted position creating a contracted air gap in between the first punch assembly and the second punch assembly.

In FIG. 1a there is shown a first embodiment of a precision tooling device 16 which comprises a punch 26a, first and second punch assemblies 28a,b and a die assembly 22. The punch is coaxially aligned with the die and support plate openings of each assembly. The first punch assembly 28a is assembled by layering, from bottom to top, a punch holder mask or die plate 30, a punch holder mask subplate 31, a punch holder insert 32, a punch holder spacer plate 34 and a punch holder back-up plate 35. This first punch assembly 28a configuration is preferred for all embodiments of the present invention. The unheaded punch 26a is fixed in the punch holder insert plate 32. The second punch assembly 28b is assembled by layering from bottom to top, a die plate 20a, a support plate 18a and a die plate 20c. The punch assemblies 28a,b are fastened together in a spaced relationship which forms an air gap 25. A helical compression spring 23 extends between the first punch assembly 28a and the second punch assembly 28b and is fixed to each assembly by a bolt 29 which is axially aligned with the spring 23. The bolt 29 is movably fixed to the first punch assembly 28a and is secured to the second punch assembly 28b. When the spring 23 is extended, the air gap 25 expands in between the first punch assembly 28a and the second punch assembly 28b as illustrated in FIG. 1a. The air gap 25 is contracted upon compressing the spring 23 as illustrated in FIG. 1b. The die assembly 22 is assembled by layering, from bottom to top, a support plate 18b and a die plate 20b. A workpiece or substrate 36 is inserted between the second punch assembly 28b and the die assembly 22. The second punch assembly 28b and die assembly 22 configurations provide additional guidance for facilitating the punching of smaller diameter holes as small as 0.00762 cm (0.003 in.). The substrate 36 is an unfired ceramic or green sheet which is used to form the layers of a multilayer ceramic circuit board (not shown) described above. The layers of each assembly are secured to one another by an adhesive (not shown).

Figure 2:
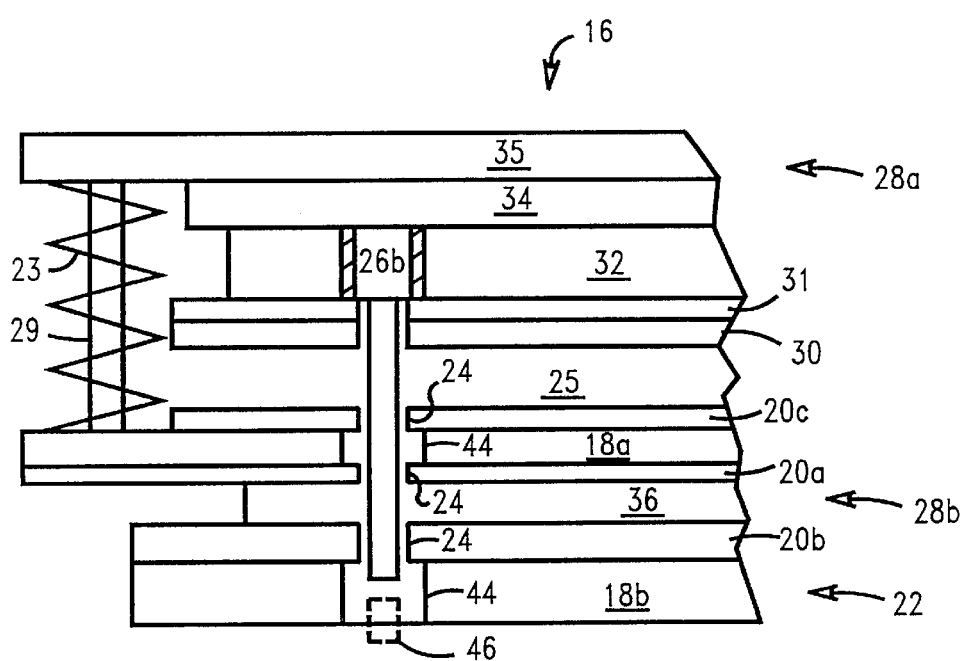
FIG. 2 is a side elevational view of the precision tooling device illustrating the use of a headed punch glued into a punch holder insert plate.
Figure 3:
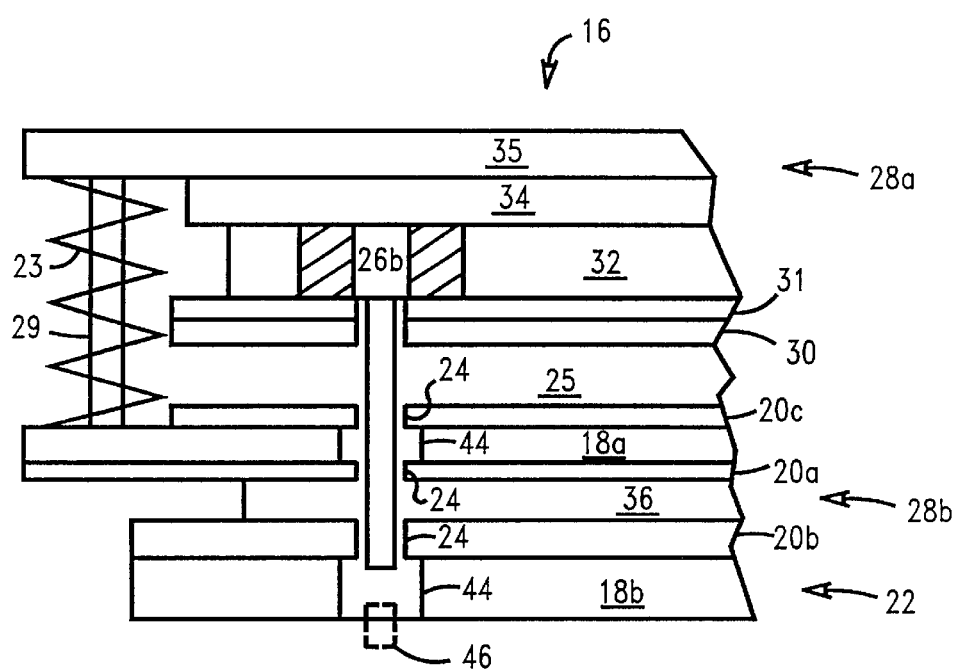
FIG. 3 is a side elevational view of the precision tooling device illustrating the use of a headed punch suspended in place by a punch holder mask subplate.
Figure 4:
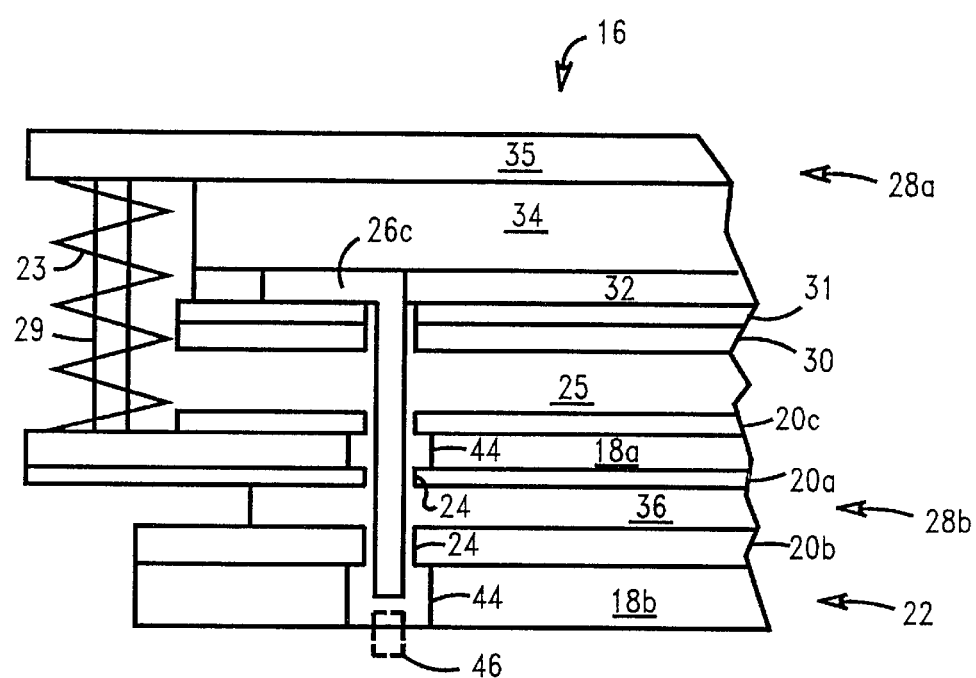
FIG. 4 is a side elevational view of the precision tooling device illustrating the use of an L-shaped punch fixed to a punch holder mask subplate.

FIGS. 2 and 3 are alternate embodiments illustrating the same assembly as FIGS. 1a,b, with various commercially available punches. FIG. 2 depicts a headed punch 26b fixed in the punch holder insert plate 32 and guided by the punch holder die plate 30 of the first punch assembly 28a. FIG. 3 depicts a removably positioned headed punch 26b with head supported by the punch holder insert plate 32 and guided by the punch holder die plate 30. Similarly, FIG. 4 depicts the same layering as the FIGS. 1–3 embodiments. An L-shaped wire punch 26c of FIG. 4 is secured to the punch holder mask subplate 31 by a method such as brazing, welding, adhering or ultrasonically bonding, with epoxy being preferred. Each punch may be used on any of the precision tooling device 16 alternate embodiments which follow.

The assembled precision tooling device 16 pierces or punches holes in a substrate 36. The punching is performed in one or two strokes. During each stroke, the punch 26 moves relative to the substrate, and is moved through punch and die assemblies. Punching performed with the embodiment of FIGS. 1a,b is as follows. The punch begins in a position where the punch bottom edge 38 is even with the first die plate bottom edge 21a. As the punch moves through the second punch assembly 28b two die plates 20a,c provide guidance, the punch passes through a die plate opening 24, support plate opening 44 and another die plate 24 before reaching the substrate. The punch 26 then contacts the substrate 36, punching a hole in the substrate 36. The punch 26 then moves through next die plate opening 24 which provides a cutting edge. A support plate opening 44 follows which is larger than the die plate opening 24. After each stroke, an air blast may be blown at the bottom of the die assembly 22 to facilitate the removal of scrap or slugs 46. On the first stroke the slug 46 sticks to the bottom of the substrate 36 and on the second stroke the slug 46 is knocked off of the substrate 36. In the alternate embodiment of FIG. 11 air is blown through a passage 40 in the second support plate 18b after each stroke. The air jet is blown into the passage from the perimeter 42 of the support plate. The air flows through the passage 40 to each opening 44 in the support plate 18b and blows the slug 46 from the substrate 36.

In each embodiment of the precision tooling device 16, a web or support plate 18 provides support for one or more precision photo etched die plates 20 which provide cutting surface and guidance in the punch and die assemblies. The precision die plate 20 is low cost and is fabricated using a standard process, such as a computer process and acid etch. The support plate 18 has essentially the same footprint as the die plate 20; however, the support plate openings 24 are slightly larger to provide clearance for the punch 26. The preferred material for the support plate 18 is 0.1270 cm (0.050 in.) stainless steel and for the die plate 20, 0.01524 cm (0.006 in.) molybdenum is preferred. The compression spring 23 is fixed to the first support plate 18a pushing the support plate down and stripping scrap or slugs 46 away from the punch 26.

The preference for the style of punch 26 used in the punch assemblies 28a,b depends upon the application. For lower cost, the unheaded punch 26a of FIG. 1a is preferred. The glued-headed punch 26b of FIG. 2 is preferred when a maximum amount of force is necessary to punch a close pattern of precision holes because the larger surface area of the punch head contacts the glue and provides increased support for the punch 26b. Economically, the headed removable punches 26b of FIG. 3 are preferred for applications where a small number of substrates will be punched, because the punches can be repatterned and used again. The L-shaped wire punch 26c of FIG. 3 are preferred for its low cost in applications where the substrate is a softer material that will not easily wear the punch.

The punches of FIGS. 1–3 can be made from tungsten carbide, stainless steel or tungsten. The preferred material for the punches of the FIGS. 1–3 embodiments is tungsten carbide, such as the small carbide punches commercially available from Great Lakes Eglinton. The preferred material for the L-shaped punch 26c of FIG. 4 is tungsten which has a lower cost and is less brittle than carbide.

Figure 5:
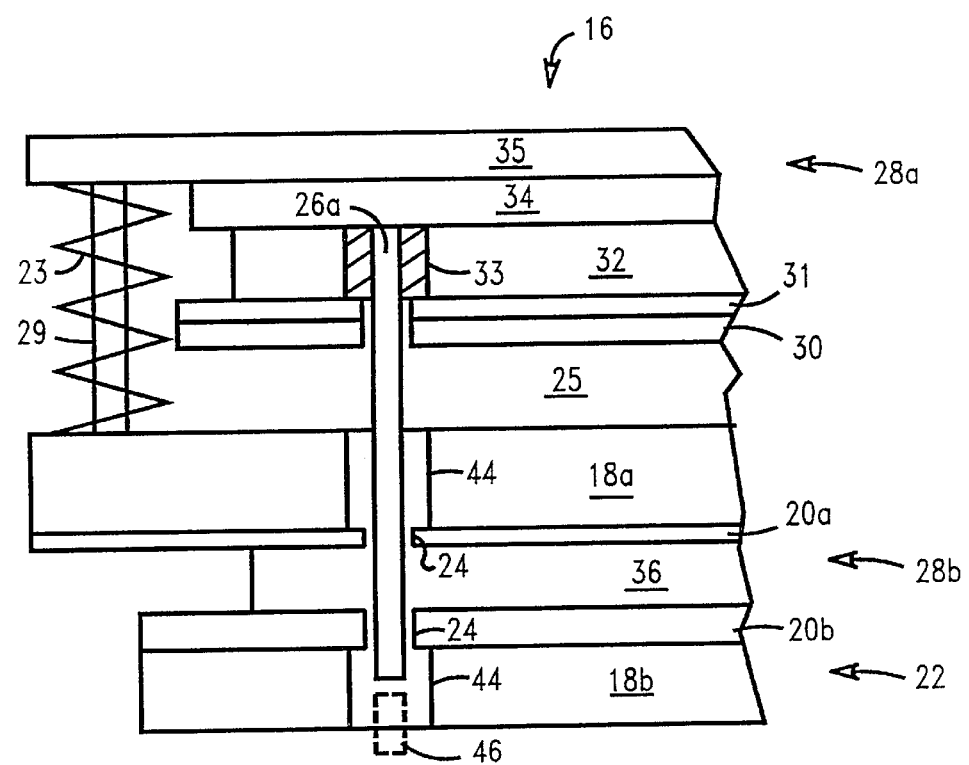
FIG. 5 is a side elevational view of the precision tooling device illustrating a first die plate positioned on the front side of a first support plate and none on the back side.
Figure 6:
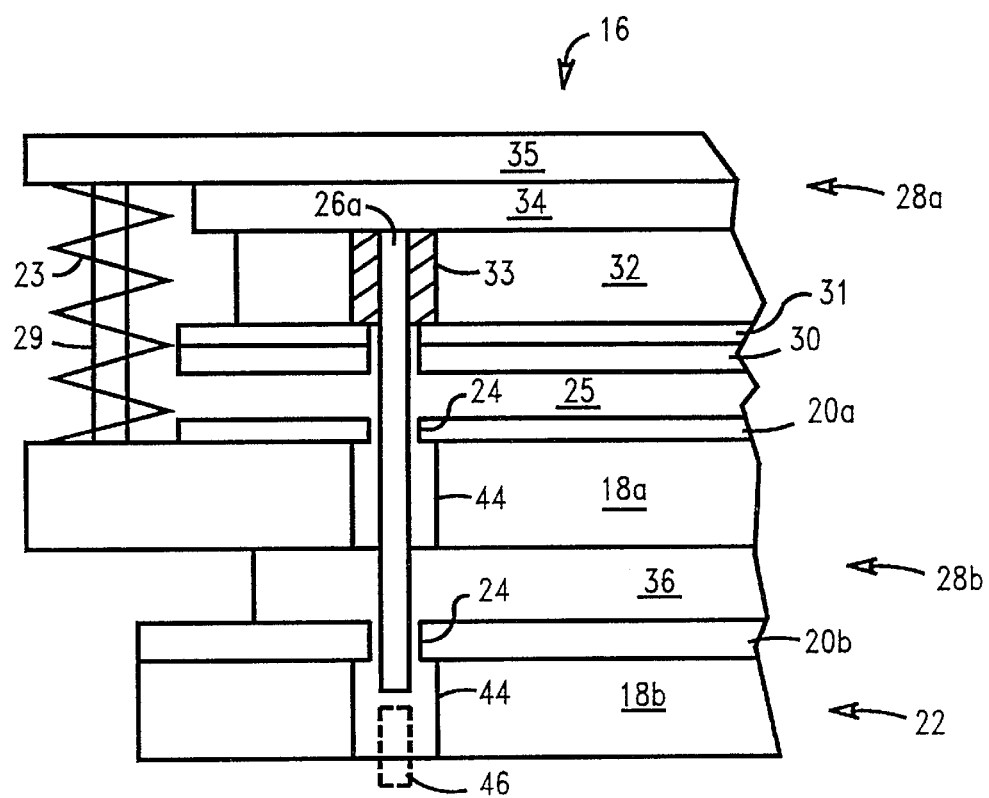
FIG. 6 is a side elevational view of the precision tooling device illustrating a third die plate positioned on the back side of a first support plate and none on the front side.

FIG. 5 illustrates the precision tooling apparatus wherein the second punch assembly 28b a first die plate 20a is layered on the front side, or side closest to the substrate, of the first support plate 18a in the die assembly 22. This configuration and the similar embodiment of FIG. 6, where a first die plate 20a is positioned on the back side, or side furthest from the substrate, of the first support plate 18a, is optimum when the precision tooling 16 requires a short die with a short stroke. Here the punch length shortened by additional plates would further shorten the stroke, therefore the punch is guided at the tip by only one die plate 18a.

Figure 7:
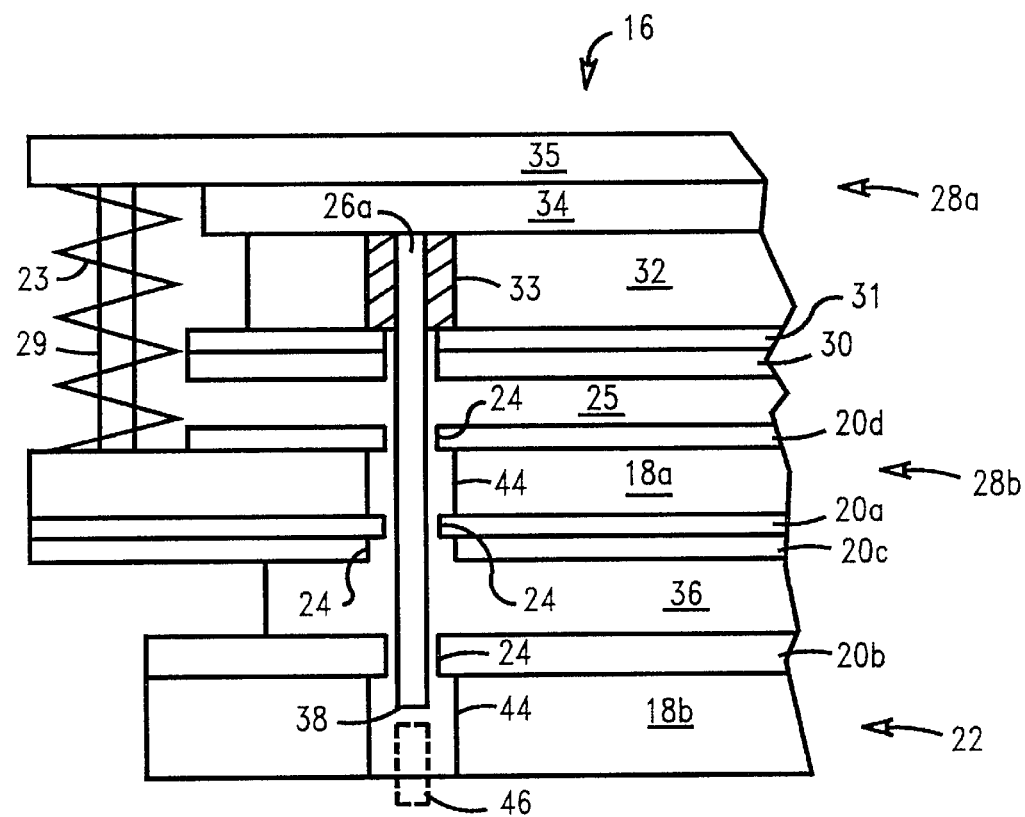
FIG. 7 is a side elevational view of the precision tooling device illustrating first and third die plates positioned on the front side of a first support plate and a fourth die plate positioned on the back side of the first support plate.
Figure 8:
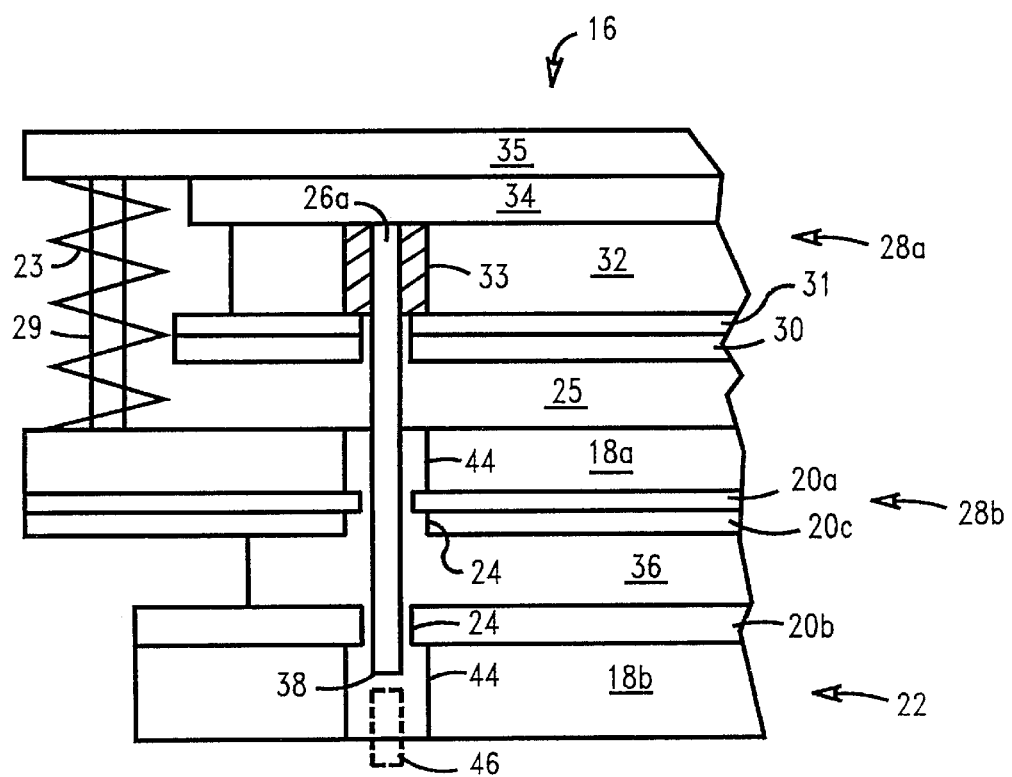
FIG. 8 is a side elevational view of the precision tooling device illustrating first and third die plates positioned on the front side of a first support plate and none on the back side.

FIG. 7 illustrates an assembly sequence of the second punch assembly 28b wherein two die plates, a first die plate 20a and a third die plate 20c, are positioned on the front side, or side closest to the substrate 36, of the first support plate 18a and a fourth die plate 20d is layered on the back side of the first support plate 18a. Also, FIG. 8 illustrates a similar multiple layering sequence to FIG. 7, omitting the fourth die plate. In both FIGS. 7 and 8, the die plate opening 24 of the first die plate 20a is smaller than the opening 24 of the third die plate 20c. In this embodiment, when the punch 26 is at rest, its bottom edge is located in the area between the first die plate 18a and the third die plate 18b in order to retain the punch position in the assembly.

Figure 9:
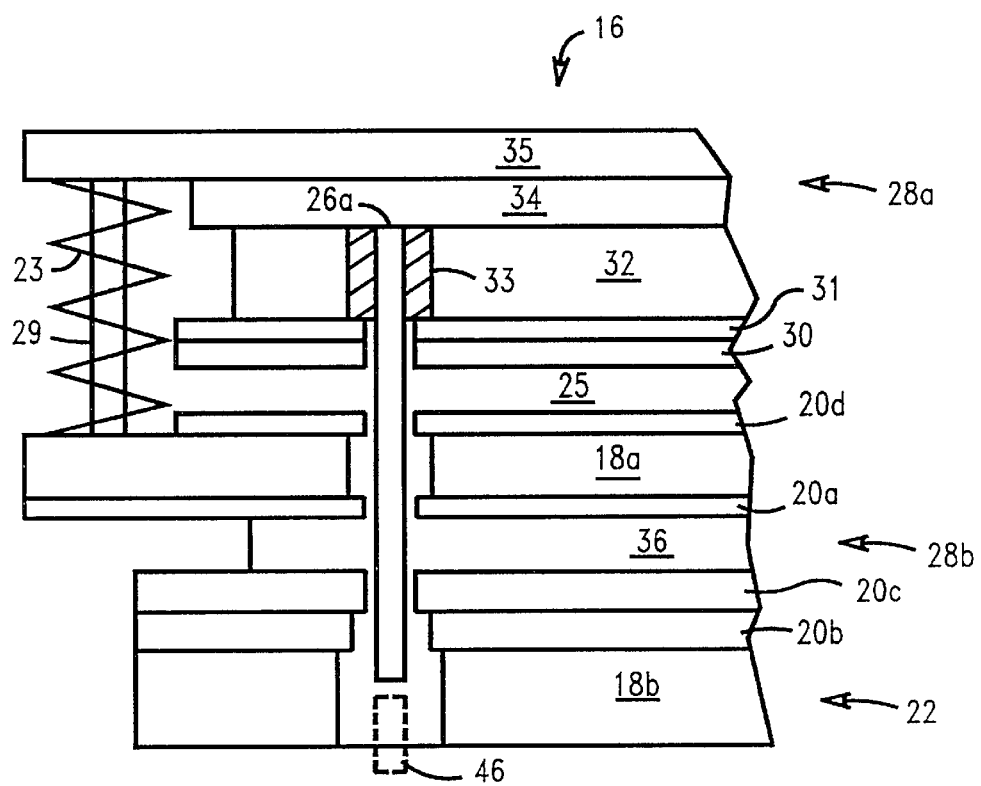
FIG. 9 is a side elevational view of the precision tooling device illustrating a first die plate positioned in between a substrate and a first support plate, second and third die plates positioned in between a second support plate and a substrate with the second die plate adjacent to the second support plate and a fourth die plate on the back side of the first support plate.
Figure 10:
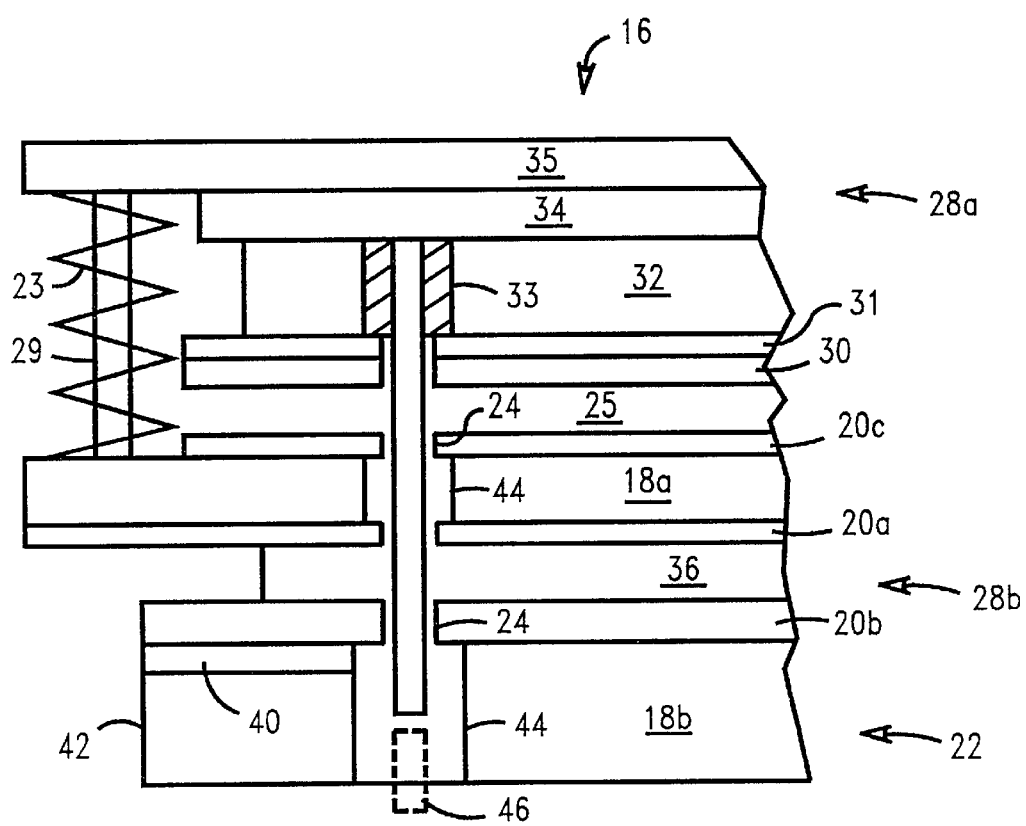
FIG. 10 is a side elevational view of the precision tooling device illustrating a first die plate in between a first support plate and a substrate, a second die plate in between a second support plate and the substrate, a third die plate on the back side of the first support plate and an air passage between the perimeter of the second support plate and the opening in the second support plate.
Figure 11:
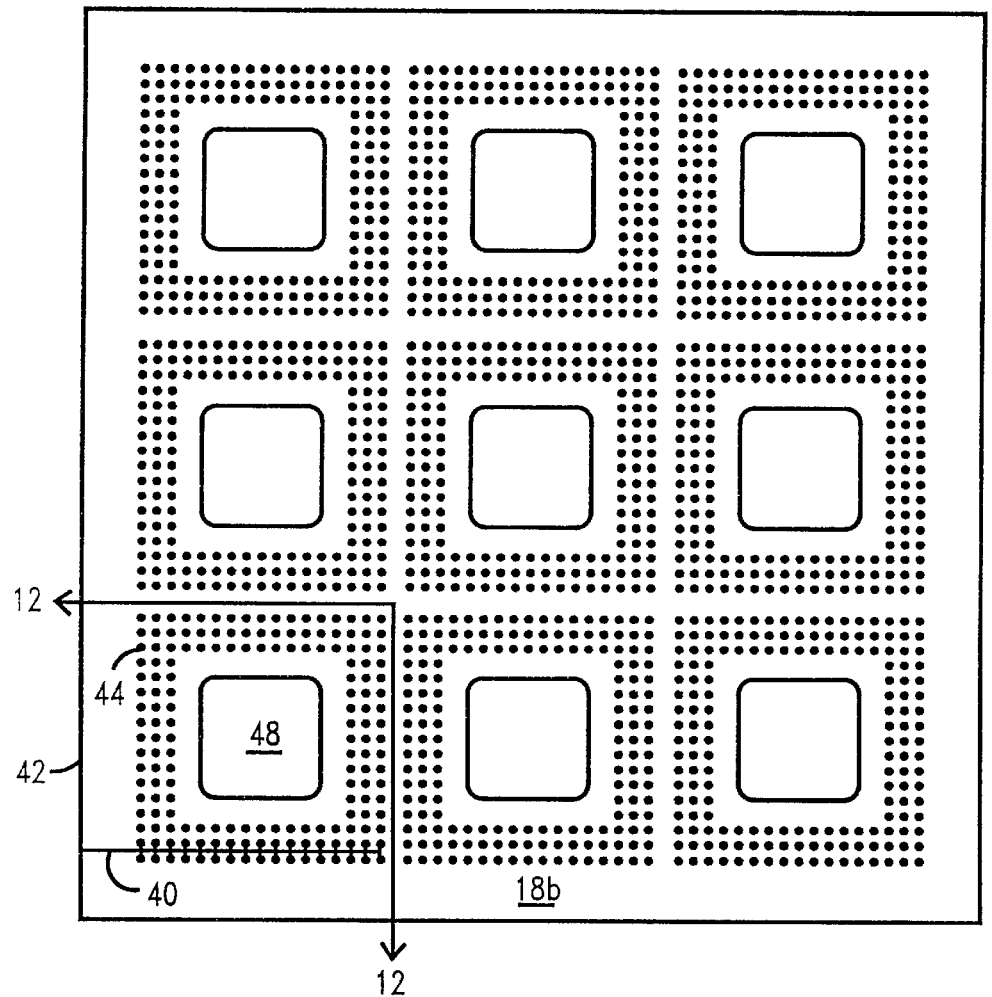
FIG. 11 is a perspective view of the second support plate of FIG. 10 illustrating etched air passages connecting the precision holes.
Figure 12:
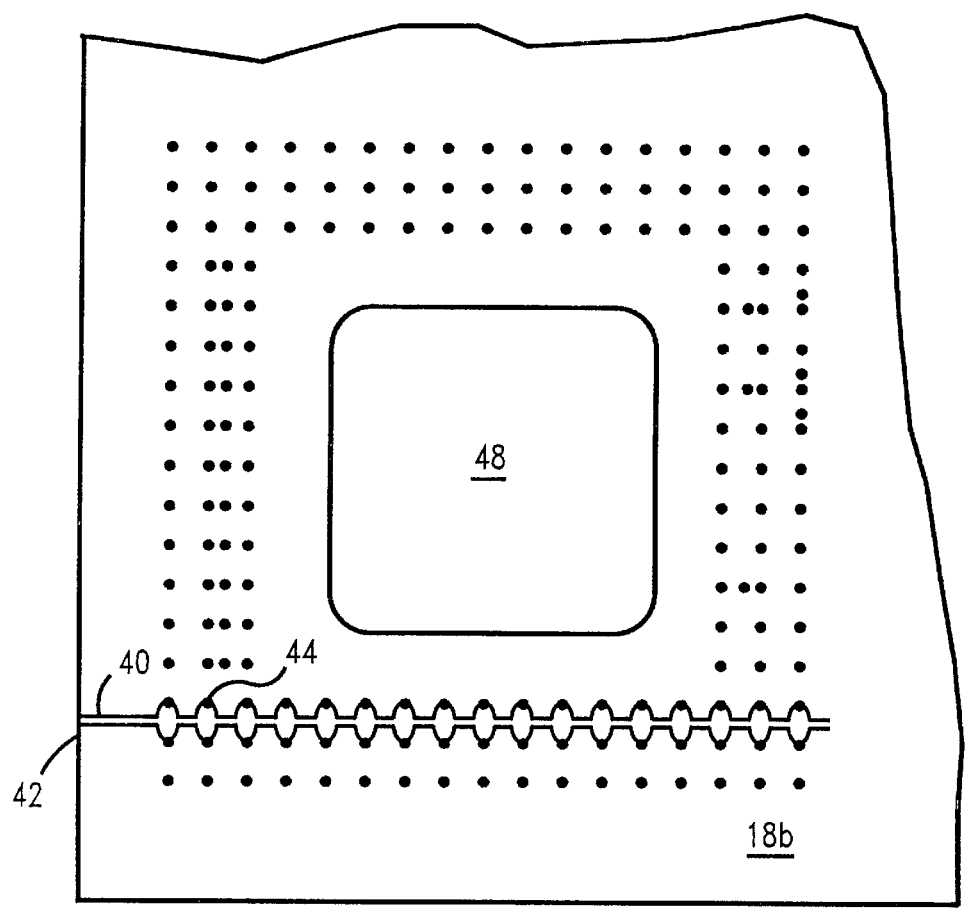
FIG. 12 is a fragmentary view of a section of the second support plate along line 12—12 of FIG. 11, greatly enlarged to show the connection of the air passage from the perimeter of the second support plate to the openings in the second support plate.

FIG. 9 illustrates an assembly sequence of the die assembly 22 wherein two die plates, a second die plate 20b and a third die plate 20c are positioned between the substrate 36 and the second support plate 18b with the second die plate 20b adjacent to the second support plate 18b. The die plate opening 24 of the third die plate 20c is smaller than the opening 24 of the second die plate 20b. The addition of the two die plates beneath the substrate 36 provides added strength to support the substrate 36 during punching. FIG. 10 illustrates a similar embodiment with only one die plate, 20b, positioned between the substrate 36 and the second support plate 18b and with the air passage 40 in the second support plate 18b connecting the perimeter 42 of the second support plate 18b to the opening 44 in the second support plate 18b. Air is blown through the passage 40 to blow a slug 46 from the die assembly 22. FIG. 11 illustrates a perspective view of the second support plate air passage 40 and also shows cavity openings 48 in the second support plate 18b. FIG. 12 illustrates an enlarged fragmentary view of the air passage 40 connection from the perimeter 42 of the second support plate to the openings 44 in the second support plate 18b.

Figure 13:
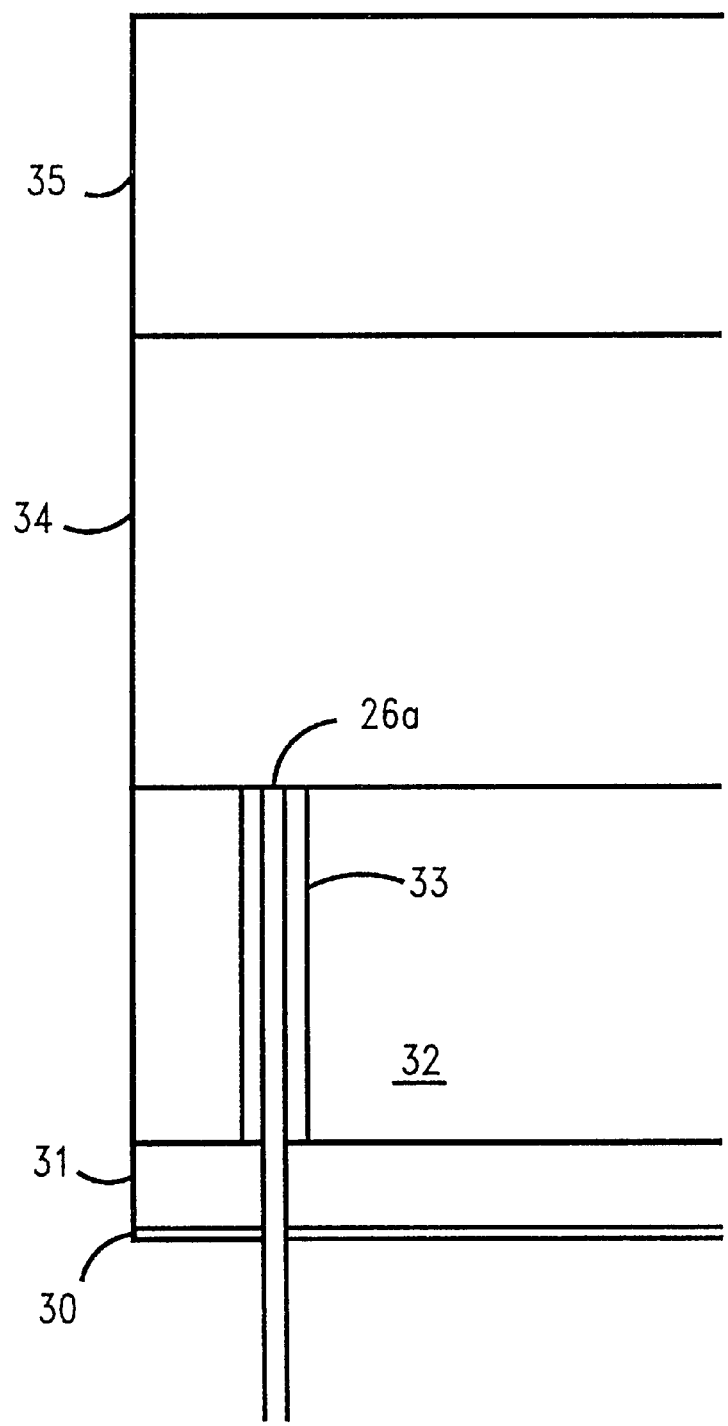
FIG. 13 is a greatly enlarged side elevational view of the punch assembly.

The assembly technique of the precision tooling device is similar for each embodiment, varying only slightly for the addition or deletion of one or more die plates. The configuration of the top or first punch assembly 28a is illustrated in FIG. 13. The device of FIG. 1a is assembled in the following manner. The second punch assembly 28b is made by gluing the first die plate 20a to the front side of the first support plate 18a and gluing the third die plate 20c to the back side of the first support plate 18a. The first punch assembly 28a is made by gluing the punch holder mask or die plate 30 to a punch holder mask subplate 31. The second punch assembly 28b is temporarily fastened to the first punch assembly 28a with a spacer between the two assemblies. The bolt 29 and compression spring 23 are fastened in between the punch assemblies 28a,b. Unheaded punches 26a are inserted into the punch holder mask subplate 31 and held in place by a thin tape (not shown) which covers the holes on the bottom of the punch holder subplate 31. The punch holder insert 32 is filled with adhesive cement or glue 33. The punch holder insert 32 is aligned with the first and second punch assemblies 28a,b and punches 26a are inserted into punch holder insert 32 by pushing the punches 26a through tape and into the adhesive. The punches are ground to align with the top of the first support plate 18a. The entire subassembly is aligned and assembled to the top of the master die. The die assembly follows wherein the second support plate 18b is glued to the second die plate 20b. Finally, the second plate assembly is assembled to the lower half of the master die and the top and bottom master die are assembled for punching. The preferred adhesive is two-part epoxy such as 1838 Green commercially available from 3M Co. Assembly may also include the addition of other punches (not shown) such as location hole punches and cavity punches.

The diameters of the punch 26, the die plate opening 24 and the support plate opening 44 are a function of the thickness and compressibility of the substrate 36 being punched. For example, in a green sheet or substrate 36 with a thickness between 0.00508 cm (0.002 in.) and 0.0508 cm (0.020 in.), a 0.02032 cm (0.008 in.) hole is punched with the precision tooling device 16 including a 0.02032 cm (0.008 in.) punch, a 0.02286 cm (0.009 in.) die plate opening and a 0.04064 cm (0.016 in.) support plate opening.

The punched substrate 36 has precision punched holes as small as (0.00762 cm) 0.003 in. diameter and is punched with diameter true position accuracy of +/−0.00127 cm (0.0005 in.) about the center of the hole which is an order of magnitude more precise than the prior art.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A precision tooling apparatus for punching holes in a substrate comprising:
   a punch fixed on a first punch assembly movable relative to a second punch assembly, said first punch assembly including a punch holder insert, a punch holder mask subplate on a first side of said punch holder insert, a punch holder mask on a side of said punch holder mask subplate opposite the punch holder insert, said punch being fixed to said punch holder insert and extending through said punch holder insert, said punch holder mask subplate and said punch holder mask, said first punch assembly further including a backup plate on a second side of said punch holder insert opposite the punch holder mask, and a punch holder spacer plate between the backup plate and the punch holder insert;

said second punch assembly positioned between said first punch assembly and a die assembly and including:
      a first die plate having a die opening therein corresponding to said punch for guiding said punch during relative movement therebetween, and
      a first support plate adjacent to said first die plate and secured thereto, said first support plate having an opening corresponding to said first die plate opening and larger than said first die plate opening; and said die assembly including:
      second die plate for receiving said substrate, such that said substrate is located between said first and second die plates, said second die plate having a die opening therein corresponding to said punch for cooperating with said punch for punching a hole in said substrate, and
      a second support plate adjacent to said second die plate and secured thereto, said second support plate having an opening corresponding to said second die plate opening and larger than said second die plate opening;

said punch and first punch assembly being movable with respect to said second punch assembly and said die assembly.

2. The apparatus as claimed in claim 1 wherein said die plates are thinner than said support plates.

3. The apparatus as claimed in claim 2 wherein said first die plate is secured to said first support plate by an adhesive, and said second die plate is secured to said second support plate by an adhesive.

4. The apparatus as claimed in claim 1 further comprising a third die plate adjacent said first support plate on a side opposite said first die plate.

5. The apparatus as claimed in claim 4 wherein said punch is a headed punch.

6. The apparatus as claimed in claim 1 wherein said second punch assembly is spaced from said first punch assembly.

7. The apparatus as claimed in claim 1 further including a spring extending between said first punch assembly and said second punch assembly.

8. The apparatus as claimed in claim 7 wherein said spring is fixed to each of said punch assemblies.

9. The apparatus of claim 7 wherein said spring is a helical compression spring.

10. The apparatus as claimed in claim 1 wherein said first die plate is secured to said first support plate by an adhesive, and said second die plate is secured to said second support plate by an adhesive.

11. The apparatus as claimed in claim 1 wherein said punch is a headed punch.

* * * * *